(12) United States Patent
Ku et al.

(10) Patent No.: US 9,693,445 B2
(45) Date of Patent: Jun. 27, 2017

(54) PRINTED CIRCUIT BOARD WITH THERMAL VIA

(71) Applicant: Avago Technologies General IP (Singapore) Pte. Ltd., Singapore (SG)

(72) Inventors: Hyun Mo Ku, Seoul (KR); Jin Jeong, Kyunggi province (KR); Deog Soon Choi, Seoul (KR); Chris Chung, Seoul (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/611,121

(22) Filed: Jan. 30, 2015

(65) Prior Publication Data
US 2016/0227641 A1    Aug. 4, 2016

(51) Int. Cl.
| | |
|---|---|
| H05K 1/02 | (2006.01) |
| H05K 7/20 | (2006.01) |
| H05K 1/11 | (2006.01) |
| H05K 1/18 | (2006.01) |
| H01L 23/367 | (2006.01) |
| H01L 23/498 | (2006.01) |
| H01L 23/373 | (2006.01) |
| H01L 23/13 | (2006.01) |

(52) U.S. Cl.
CPC ....... *H05K 1/0206* (2013.01); *H01L 23/3677* (2013.01); *H01L 23/49827* (2013.01); *H05K 1/112* (2013.01); *H05K 1/115* (2013.01); *H05K 1/183* (2013.01); *H01L 23/13* (2013.01); *H01L 23/3736* (2013.01); *H01L 2224/48091* (2013.01); *H01L 2224/48227* (2013.01); *H01L 2224/73265* (2013.01); *H05K 2201/09563* (2013.01); *H05K 2201/09827* (2013.01)

(58) Field of Classification Search
CPC .............. H05K 1/0201–1/0212; H05K 1/0272
See application file for complete search history.

(56) References Cited

U.S. PATENT DOCUMENTS

| | | | | |
|---|---|---|---|---|
| 4,739,448 A | * | 4/1988 | Rowe ...................... | H01L 23/66 333/238 |
| 5,285,352 A | * | 2/1994 | Pastore ................... | H01L 23/36 165/185 |
| 5,708,566 A | * | 1/1998 | Hunninghaus ....... | H05K 1/0206 174/252 |
| 5,814,883 A | * | 9/1998 | Sawai ..................... | H01L 23/04 257/675 |

(Continued)

OTHER PUBLICATIONS

Smith, "The Engineer's Guide to High-Quality PCB Design", Electronic Design, Jul. 17, 2013.

(Continued)

*Primary Examiner* — Robert J Hoffberg (57) ABSTRACT

A PCB includes a copper seed layer, a dielectric layer provided on the copper seed layer, a first thermal via and a plurality of second thermal vias disposed around the first thermal via. The first thermal via has a first through-hole in the dielectric layer and a first copper portion filled in the first through-hole, and each of the second thermal vias has a second through-hole in the dielectric layer and a second copper portion filled in the second through-hole. A mounting portion configured to mount a semiconductor device thereon is provided on the first copper portion.

21 Claims, 11 Drawing Sheets

(56) References Cited

U.S. PATENT DOCUMENTS

| | | | | |
|---|---|---|---|---|
| 6,414,847 B1* | 7/2002 | Hutchison | H01L 23/3677 | 165/185 |
| 6,521,990 B2* | 2/2003 | Roh | H01L 23/3128 | 257/698 |
| 6,605,778 B2* | 8/2003 | Raith | H01L 23/367 | 174/524 |
| 7,026,664 B2* | 4/2006 | Divakar | H01L 23/3677 | 174/252 |
| 7,214,419 B2 | 5/2007 | Umeda et al. | | |
| 7,265,983 B2* | 9/2007 | Frisch | H01L 23/3677 | 165/185 |
| 7,269,017 B2* | 9/2007 | Berlin | H01L 23/3677 | 165/185 |
| 7,473,099 B2* | 1/2009 | Kim | H05K 3/4641 | 174/263 |
| 7,741,158 B2* | 6/2010 | Leung | H01L 23/13 | 257/713 |
| 7,810,232 B2* | 10/2010 | Kim | H05K 3/4641 | 29/825 |
| 7,978,031 B2* | 7/2011 | Goi | H04B 1/03 | 333/247 |
| 8,093,506 B2* | 1/2012 | Kawabe | H01L 23/49822 | 174/262 |
| 8,166,650 B2* | 5/2012 | Thomas | H05K 1/0206 | 228/180.22 |
| 8,319,336 B2* | 11/2012 | Chang | H01L 21/486 | 257/718 |
| 8,373,997 B2* | 2/2013 | Kobayashi | H01L 23/3677 | 361/764 |
| 8,476,116 B2* | 7/2013 | Chang | H01L 21/486 | 257/E23.101 |
| 8,482,929 B2 | 7/2013 | Slaton et al. | | |
| 8,592,959 B2* | 11/2013 | Fujii | H01L 23/04 | 257/664 |
| 8,859,908 B2* | 10/2014 | Wang | H05K 1/0206 | 174/252 |
| 8,891,241 B2* | 11/2014 | Chao | H01L 23/3677 | 257/659 |
| 9,059,152 B2* | 6/2015 | Inoue | H05K 1/118 | 174/260 |
| 9,324,929 B2* | 4/2016 | Horikawa | H01L 33/642 | |
| 2004/0136162 A1* | 7/2004 | Asai | H05K 1/0207 | 361/715 |
| 2005/0272252 A1* | 12/2005 | Usui | H01L 23/142 | 438/624 |
| 2006/0226928 A1* | 10/2006 | Henning | H05K 1/0222 | 333/33 |
| 2008/0122061 A1* | 5/2008 | Edwards | H01L 23/3677 | 257/690 |
| 2010/0309632 A1* | 12/2010 | Chen | H01L 23/34 | 361/709 |
| 2011/0260299 A1 | 10/2011 | Edwards et al. | | |
| 2012/0077449 A1* | 3/2012 | Ohashi | H05K 1/0206 | 455/114.3 |
| 2012/0261166 A1* | 10/2012 | Oh | H05K 1/0206 | 174/252 |
| 2014/0144677 A1* | 5/2014 | Wang | H05K 1/0206 | 174/252 |
| 2015/0351219 A1* | 12/2015 | Oh | H05K 1/0206 | 174/252 |
| 2017/0018478 A1* | 1/2017 | Maple | H01L 23/367 | |

OTHER PUBLICATIONS

Sengupta, "Power System Design: Almost (But Not Quite) "Plug and Play"", Texas Instruments, Feb. 13, 2013.

* cited by examiner

PRINTED CIRCUIT BOARD WITH THERMAL VIA

BACKGROUND

A printed circuit (PCB) on which a semiconductor device is mounted includes thermal vias for sinking heat generated from the semiconductor device mounted thereon. The heat is released out of the PCB through the thermal vias formed in the PCB.

The thermal vias are formed by filling through-holes formed in the PCB with copper, by way of employing, e.g., a dielectric layer stacked on a copper seed layer of the PCB. Before filling the through-holes with copper, the copper seed layer should be electrically charged. Electrons for electrically charging the copper seed layer are supplied to the copper seed layer through an electroless copper layer (dummy copper layer) provided on an inner wall surface of each of the through-holes. A package substrate (PKGSUB) machine controlling a Cu tank is used to fill the through-holes with copper and diffuse positively charged copper toward the copper seed layer within the through-holes (primary copper diffusion process). In the primary copper diffusion process, since the electroless copper layer and the copper seed layer are electrically charged by the electrons, the positively charged copper is attracted not only toward the copper seed layer but also toward the inner wall surface of each of the through-holes. In other words, the through-holes are not uniformly filled with copper by carrying out the primary copper diffusion process alone. For this reason, an additional copper diffusion process (secondary copper diffusion process) may be required in uniformly filling the through-holes with copper, entailing extra manufacturing time and cost. In particular, in case of forming thermal vias for a multi-layer PCB in which a plurality of dielectric layers are laminated on a copper seed layer, the manufacturing inefficiency may become even further aggravated because the primary and the secondary diffusion processes may need be carried out for each dielectric layer.

What is needed, therefore, is a PCB that overcomes at least the shortcomings of the known PCB discussed above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meanings, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "uppper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° C. with respect to the view in the drawings, an element described "above" or "below" another element would now be "adjacent" to the other element; where "adjacent" means either abutting the other element, or having one or more layers, materials, structures, etc., between the elements.

As used herein, the terms "thermal via" and "PCB" may mean "via" and "package substrate", respectively. Thus, the terms "thermal via" and "PCB" may be used interchangeably with the terms "via" and "package substrate", respectively.

Figure 1:
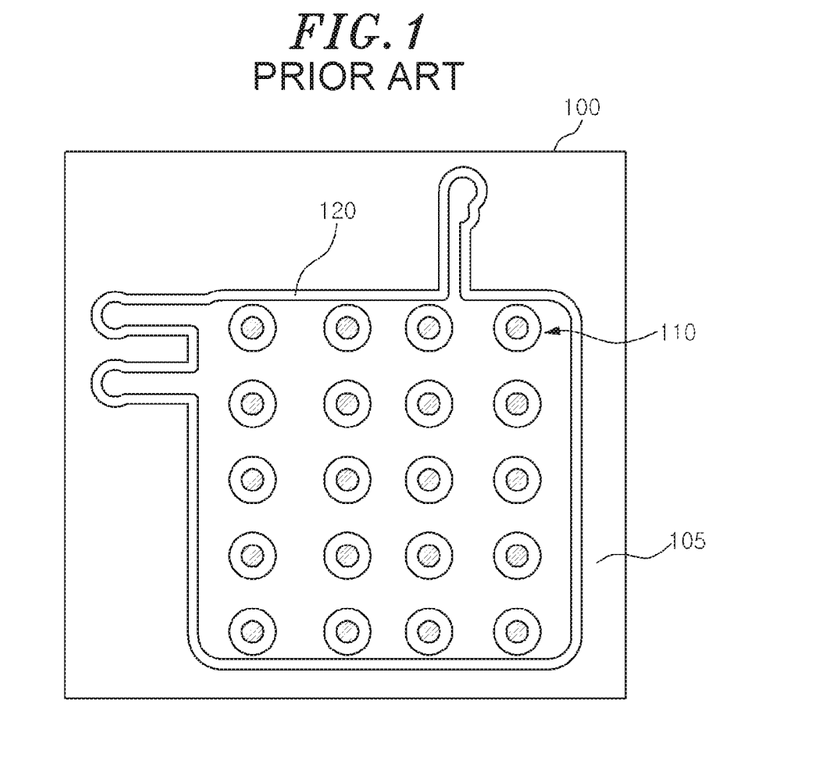
FIG. 1 shows a PCB including known thermal vias.

FIG. 1 shows a PCB 100 includes a dielectric layer 105, and a plurality of known thermal vias 110. The PCB 100 may further include a die pad 120. Each of the thermal vias 110 is formed by filling with copper a through-hole formed within the dielectric layer 105. The through-hole for forming a thermal via is a hole that penetrates through the dielectric layer 105. Each of thermal vias 110 and a method for forming the thermal vias 110 will be explained in detail with reference to FIGS. 2 and 3.

The die pad 120 may represent a position at which a semiconductor device, such as a die or an active element, is mounted on the PCB 100. The die pad 120 may be made of a conductive material. The die pad 120 may be a component on the PCB 100 that allows a semiconductor device mounted on the PCB 100 to connect with a signal via for transmitting and receiving signals.

When a semiconductor device is mounted on the surface of the PCB 100, the heat generated from the semiconductor device is released out of the PCB 100 through the thermal vias 110. These thermal vias 110 act like single bigger thermal via.

Figure 2:
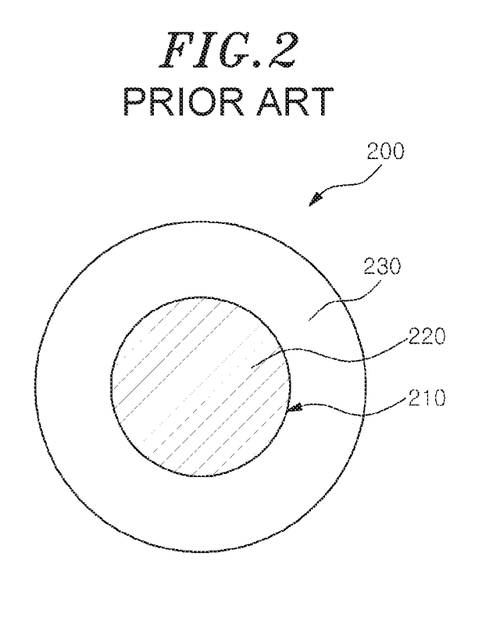
FIG. 2 is a top view of the known thermal vias illustrated in FIG. 1.

FIG. 2 represents one of the known thermal vias illustrated in FIG. 1. A thermal via 200 is formed in the dielectric layer, and corresponds to each of the thermal vias 110 described in FIG. 1. The thermal via 200 may be formed by using a package substrate (PKGSUB) machine (not shown). The PKGSUB machine may be an apparatus that is configured to conduct stacking a dielectric layer on a copper seed layer, drilling the dielectric layer to form a through-hole, and filling the through-hole with copper to form a thermal via.

The thermal via 200 includes a through-hole 210 penetrating through the dielectric layer, and a copper portion 220 filled in the through-hole 210. Along the periphery of the through-hole 210 on the surface of the dielectric layer (or PCB), a via pad 230 may be disposed. In this regard, the copper portion 220 may be filled in not only the through-hole 210 but also an extended space of the through-hole 210 that results from the disposition of the via pad 230. The via pad 230 may be made of a conductive material, for example, copper.

The through-hole 210 may be formed by drilling the dielectric layer. At a position indicated by the via pad 230, for example, the dielectric layer is drilled to form the through-hole 210. In this regard, the via pad 230 may serve as a targeting point director in forming the through-hole 210. Alternatively, the via pad 230 may function to fix the shape of the though-hole 210 after the formation of the through-hole 210.

The detailed description will be given of the filling of the through-hole 210 with copper and the operation of the PKGSUB machine, with reference to FIG. 3.

Technical descriptions provided with reference to FIG. 1 may be applicable hereto and thus, repeated descriptions may be omitted here for brevity.

Figure 3:
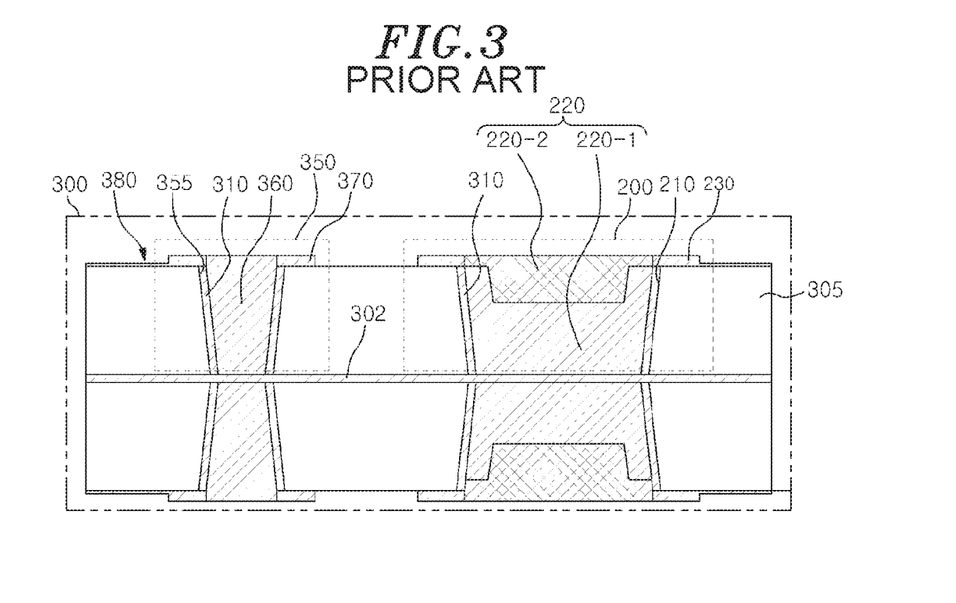
FIG. 3 is a cross-sectional view of a PCB having known thermal vias.

FIG. 3 illustrates a schematic cross-sectional view of a PCB having the known thermal vias. Together with the thermal via 200, a signal via 350 is formed in a PCB 300, as shown in FIG. 3. The signal via 350 may be a via for signal transmission/reception of semiconductor device mounted on the PCB 300. A diameter of the through-hole 355, used for forming the signal via 350, on the surface of the dielectric layer 305 may be smaller than a diameter of the through-hole 210, used for forming the thermal via 200. For example, the through-hole 210 may have a diameter of 150 μm while the through-hole 355 may have a diameter of 75 μm. A via pad 370 may be disposed on the surface of the dielectric layer 305 (or the PCB 300), along the periphery of the through-hole 355.

In order to form a thermal via 200 and a signal via 350 in the dielectric layer 305, first, a dielectric layer 305 is stacked on a copper seed layer 302, which serves as a base layer. In the stacked dielectric layer 305, a through-hole 355 and a through-hole 210 are formed. For example, the dielectric layer 305 may be drilled to form the through-holes 355 and 210, the through-holes 355 and 210 may penetrate through the dielectric layer 305 such that the surface of the copper seed layer 302 is partially exposed therethrough.

On each of inner wall surfaces of the through-holes 355 and 210, an electroless copper layer 310 is provided. An electrical connection may be made between the electroless copper layer 310 and the PKGSUB machine through a PKGSUB pattern 380 formed of, for example, copper on the surface of the dielectric layer 305. The PKGSUB machine works to migrate electrons through the electroless copper layer 310 toward the copper seal layer 302 that is thus negatively charged. The PKGSUB machine can control a copper tank (not shown) to primarily diffuse positively charged copper toward the through-holes 355 and 210. In this regard, copper can be diffused over the entire surface of the dielectric layer, like the application of copper to the entire surface by a rolling machine. By this primary copper diffusion, the smaller through-hole 355 can be completely filled with copper whereas the bigger through-hole 210 may be partially filled with copper. That is to say, the primary copper diffusion process renders the through-hole 355 filled with a copper portion 360, but allows the through-hole 210 to be filled only with a copper portion 220-1. To further fill the left portion of the through-hole 210 with copper, the PKGSUB machine may perform a secondary copper diffusion process. The secondary copper diffusion process may be carried out selectively only far unfilled through-holes (not shown). In other words, the PKGSUB machine can identify unfilled through-holes by the operation of a tolerance sensor installed therein, and thus can selectively fill the through-holes with copper in the secondary copper diffusion process. By the secondary copper diffusion process, the through-hole 210 can be filled with a copper portion 220-2. After the formation of the thermal via 200, the PKGSUB pattern 380 is removed by, for example, etching.

By repeating the above-mentioned processes, a thermal via 200 and signal via 350 can be formed on a multi-layer PCB. In addition, as shown in FIG. 3, the thermal via and the signal via may be symmetrically formed reflecting the copper seed layer 302 serving as a symmetric axis. In this context, the PKGSUB machine can simultaneously form thermal vias and signal vias of both sides symmetrical each other with regard to the copper seed layer 302.

Technical descriptions provided with reference to FIGS. 1 and 2 may be applicable hereto and thus, repeated descriptions will be omitted here for brevity.

Figure 4:
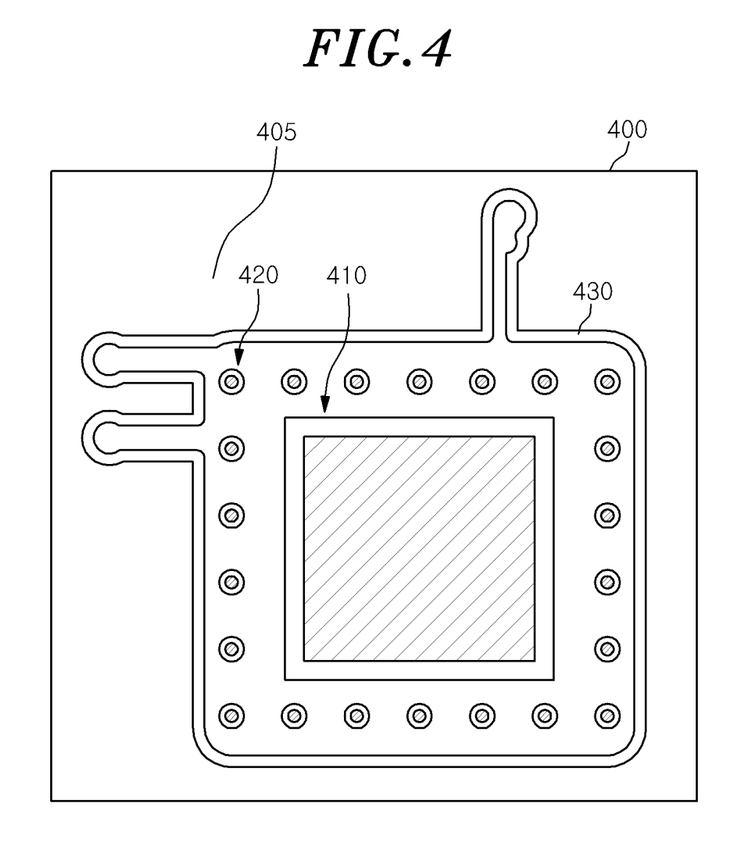
FIG. 4 is a top view of a PCB in accordance with a representative embodiment.

FIG. 4 illustrates a top view of a PCB 400 in accordance with a representative embodiment. PCB 400 comprises a dielectric layer 405, a primary thermal via 410, and a plurality of secondary thermal vias 420. The PCB 400 may further include a die pad 430. The secondary thermal vias 420 may be disposed around the primary thermal via 410, for example, to surround the primary thermal via 410. Each of the secondary thermal vias 420 may be formed by filling a through-hole formed in the dielectric layer 405 with copper. As for the thermal via 410, its formation is also achieved by filling a through hole formed in dielectric layer 405 with copper. The through-hole for forming each secondary thermal via or the primary thermal via 410 may be a hole that penetrates through the dielectric layer 405.

When viewed in a direction perpendicular to the surface of the PCB 400, each of the through-holes used for the formation of secondary thermal vias 420 has a diameter of approximately 120 μm or less at the surface of PCB 400. Further, when viewed in the same direction, the area of the primary thermal via 410 (i.e., an exposed area of the primary thermal via 410) may be larger than that of each of the secondary thermal vias 420.

In addition, each of the secondary thermal vias 420 may be disposed at a regular interval around the primary thermal via 410 on the surface of the PCB 400. That is to say, each of the secondary thermal vias 420 may be spaced at a constant distance from an adjacent secondary thermal via 420. In this regard, the distance between two adjacent secondary thermal vias 420 may be the distance between centers of the through-holes for forming the secondary thermal vias 420.

The structures and the forming method of the primary thermal via 410 and the secondary thermal vias 420 will be described in detail with reference with FIGS. 5 through 10.

A die pad 430 may represent a position at which a semiconductor device, such as a die or an active element, is mounted on the PCB 400. The die pad 430 may be made of a conductive material. The die pad 430 may be a structure on the PCB 400 that allows a semiconductor device mounted on the PCB 100 to connect with a signal via for transmitting and receiving signals. In this context, the semiconductor device may be mounted only on at least a part of the surface of the primary thermal via 410.

When a semiconductor device is mounted on the surface of the primary thermal via 410, heat generated by the semiconductor device is dissipated through the thermal via 410.

The PCB 400 may constitute a part of any electronic apparatus although not shown.

Figure 5:
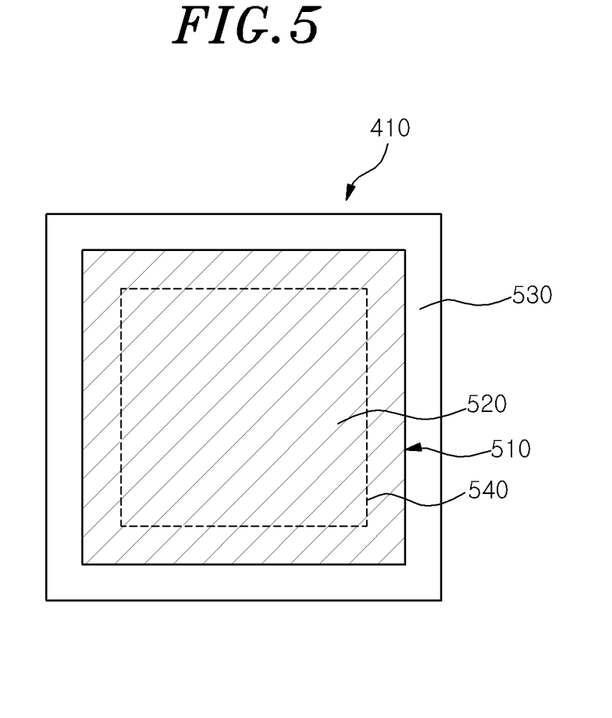
FIG. 5 is a top view of a primary thermal via illustrated in FIG. 4.

FIG. 5 is a top view of primary thermal via 410, which is disposed in the dielectric layer 405. The formation of the primary thermal via 410 may be achieved using the PKG-SUB machine. The primary thermal via 410 includes a through-hole 510 penetrating through the dielectric layer 405, and a copper portion 520 filled in the through-hole 510. Illustratively, along the periphery of the through-hole 510 on the surface of the dielectric layer 405 (or PCB 400), a via pad 530 is disposed. The via pad 530 may be made of a conductive material, for example, copper.

The through-hole 510 is formed by mechanically drilling the dielectric layer 405. At a position indicated by the via pad 530, for example, the dielectric layer is drilled to form the through-hole 510. In this regard, the via pad 530 may serve as a targeting point director in forming the through-hole 510. Further, the via pad 530 may function to fix the shape of the through-hole 510 after the formation of the through-hole 510.

Alternatively, the through-hole 510 may be formed by laser drilling the dielectric layer 405. The use of a laser drill may allow the through-hole 510 to be formed without necessitating use of the via pad 530 as a targeting point director. When viewed in a direction perpendicular to the surface of PCB 400, a shape of the through-hole 510 on the surface of PCB 400 may be rectangular when the through-hole 510 is formed by laser drilling. Alternatively, the through-hole 510 may have different shapes depending on the drilling mode of the laser drill.

On the primary thermal via 410, a mounting portion 540 for mounting a semiconductor device thereon is provided. The mounting portion 540 may be positioned within the copper portion 520 filled in the through-hole 510. That is, the mounting portion 540 may be provided on the copper portion 520 filled in the through-hole 510. Further, the position of the mounting portion 540 may be provided only on the copper portion 520.

The mounting portion 540 may include any device useful for mounting a semiconductor device thereto. For example, the mounting portion 540 may include a socket for mounting a semiconductor device or an adhesive layer for fixing semiconductor device on the copper portion 520.

The semiconductor device to be mounted on the mounting portion 540 may be an active device such as amplifier. The semiconductor device to be mounted on the mounting portion 540 may be confined in its entirety within the mounting portion 540 or a portion of the mounting portion 540. In other words, the area of the semiconductor device to be mounted on the mounting portion 540 is illustratively smaller than the size of the mounting portion 540 (i.e., the area of the mounting portion 540 on the copper portion 520).

With regard to the forming method of the through-hole 510 and the method of filling through-hole 510 with copper, the detailed description will be given referring to FIGS. 8 through 10.

Technical descriptions provided with reference to FIG. 4 may be applicable hereto and thus, repeated descriptions will be omitted here for brevity.

Figure 6:
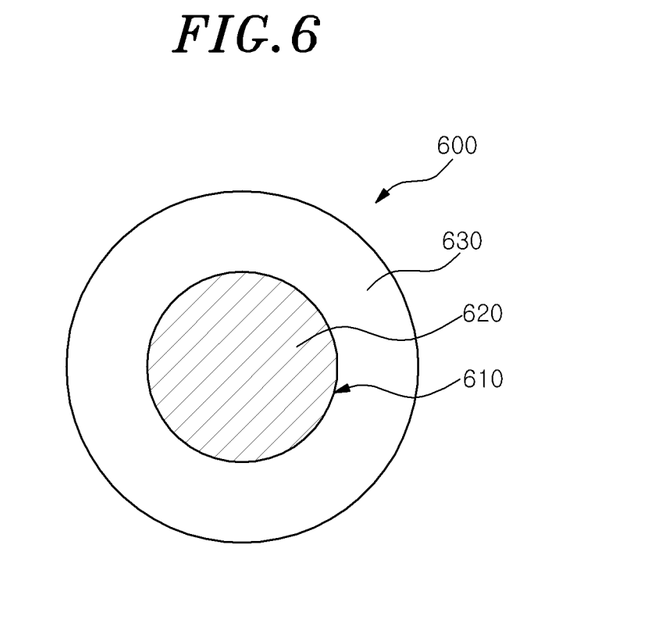
FIG. 6 is a top view of a secondary thermal via illustrated in FIG. 4.

FIG. 6 depicts a top view of a secondary thermal via 600 in accordance with a representative embodiment. The secondary thermal via 600 is formed in the dielectric layer, and may be used for one or more of the secondary thermal vias 420 described with reference to FIG. 4. The secondary thermal via 600 illustratively includes a through-hole 610 penetrating through the dielectric layer, and a copper portion 620 filled in the through-hole 610. Along the periphery of the through-hole 610 on the surface of the dielectric layer 405 (or PCB 400), a via pad 630 may be disposed. The via pad 630 may be made of a conductive material, for example, copper.

The secondary thermal via 600 may be formed using some techniques described in connection with the formation of the thermal via 200 described with reference to FIG. 3; however, in the filling of the through-hole 610 with copper, the secondary copper diffusion process does not need to be performed because a diameter of the through-hole 610 is smaller than that of the through-hole 210. That is to say, a diameter of the through-hole 610 may be sufficiently small to allow the through-hole 610 to be filled with the copper portion 620 even by the primary copper diffusion process alone. For instance, the through-hole 610 has a diameter of approximately 120 μm or less, so the copper portion 620 may be filled in not only the through-hole 610 but also an extended space of the through-hole 610 that results from the disposition of the via pad 630. In other words, the exposed surface of the copper portion 620 and the surface of the via pad 630 may be substantially coplanar.

With regard to the method for forming the through-hole 610 and the method for filling through-hole 610 with copper, the detailed description will be given referring to FIG. 7.

Technical descriptions provided with reference to FIGS. 1 through 5 may be applicable hereto and thus, repeated descriptions will be omitted here for brevity.

Figure 7:
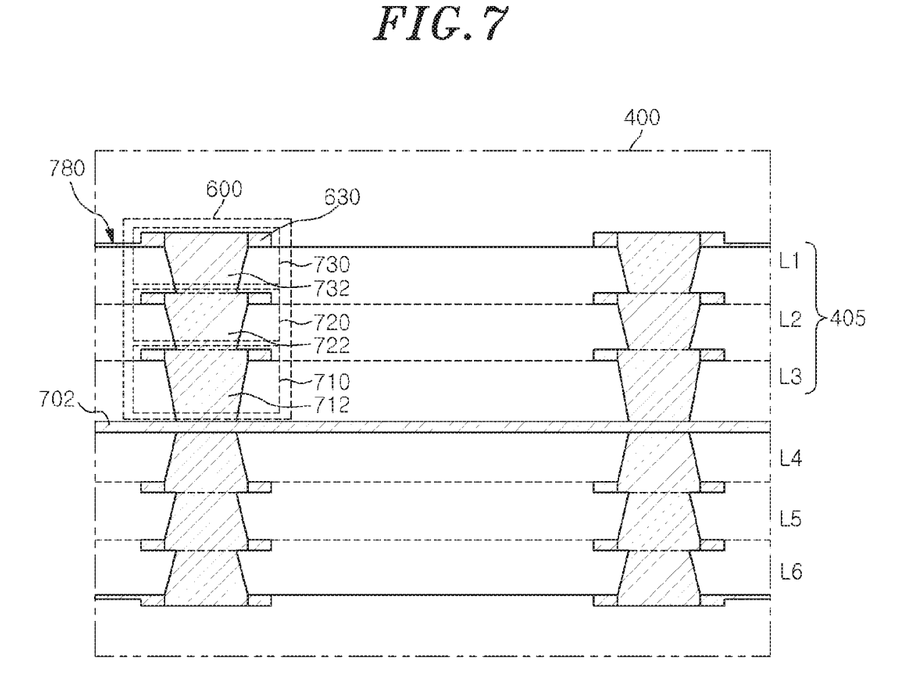
FIG. 7 is a cross-sectional view of a PCB comprising secondary thermal vias in accordance with a representative embodiment.

FIG. 7 shows a cross-sectional view of PCB 400 under a manufacturing process in which secondary thermal vias illustrated in FIG. 4 are formed. With reference to FIG. 7, a method for forming a plurality of secondary thermal vias in the above-mentioned PCB 400 is explained, below.

The PCB 400 may be a multi-layer PCB, which illustratively comprises six (6) dielectric layers sequentially stacked in bipartite (L1 to L3, and L4 to L6) on opposite sides of the copper seed layer 702. For example, the dielectric layer L2 or L1 may be an additional one provided on the dielectric layer L3.

Below, a description will be given of a method for forming a secondary thermal via 600, one of the plurality of the secondary thermal vias; however, each of the secondary thermal vias can be formed in the same manner as the formation of the secondary thermal via 600. In addition, as can be seen in FIG. 7, one dichotomous panel of dielectric layers L1 to L3, together with their secondary thermal vias, may be symmetrically formed with the reflection of the other dichotomous panel of dielectric layers L4 to L6, together with their secondary thermal vias, while the copper seed layer 702 serves as a symmetric axis. For the sake of convenience, only the dielectric layers L1 to L3, and their secondary thermal vias are described, whereas the explanation of the dielectric layers L4 to L6 is omitted.

Secondary thermal vias 720 or 730 formed in the additional dielectric layer L2 or L1 are illustratively disposed around (e.g., along the periphery of) an area of the dielectric layer 405 in which the primary thermal via 410 will be formed. The number of the secondary thermal vias 720 or 730 formed in the dielectric layer L2 or L1 may be substantially equal to the number of the secondary thermal vias 710 formed in the dielectric layer L3. In addition, each of the secondary thermal vias 720 formed in the dielectric layer L2 or L1 and each of the secondary thermal vias 710 formed in the dielectric layer L3 are thermally connected with each other. For example, each of the secondary thermal vias 720, 730 formed in the dielectric layer L2 or L1 and each of the secondary thermal vias 710 formed in dielectric layer L3 are electrically in contact with each other.

As can be seen in FIG. 7, a first secondary thermal via 710 corresponds to one of the secondary thermal vias 710 formed in the dielectric layer L3, second secondary thermal via 720 to one of the secondary thermal vias 720 formed in the dielectric layer L2, and a third secondary thermal via 730 to one of the secondary thermal vias 730 formed in the dielectric layer L1. The first secondary thermal via 710 in the dielectric layer L3, the second secondary thermal via 720 in the dielectric layer L2, and the third secondary thermal via 730 in the dielectric layer L1 can be formed sequentially to form a secondary thermal vias 600, thus building a via thermally conductive column.

When viewed in a direction perpendicular to the surface of the PCB 400, a diameter of a through-hole for forming the first secondary thermal via 710 and a diameter of a through-hole for forming the second secondary thermal via 720 may be substantially equal to a diameter of a through-hole for forming the third secondary thermal via 730.

The first secondary thermal via 710, the second secondary thermal via 720, and the third secondary thermal via 730 may be formed by a known method such as described above in connection with FIG. 3. For example, the first secondary thermal via 710 may be formed by carrying out stacking the dielectric layer L3 on the copper seed layer 702, drilling the dielectric layer L3 to form a through-hole penetrating through the dielectric layer L3, forming an electroless copper layer on an inner wall surface of the through-hole, and filling the through-hole with copper by performing the primary copper diffusion process. The same process as in the formation of the first secondary thermal via 710 can be applied to the formation of the second secondary thermal via 720 and the third secondary thermal vial 730 after the dielectric layers L2 and L3 are stacked, respectively.

The first secondary thermal via 710, the second secondary thermal via 720 and the third secondary thermal via 730 may be aligned so as to be in contact with each other in the dielectric layer 405. That is, the copper portions 722 and 732 filled in the through-holes of the second secondary thermal via 720 and the third secondary thermal via 730, respectively, are aligned with the copper portion 712 filled in the through-hole of the first secondary thermal via 710 to form a secondary thermal via 600, thus building a via column.

The secondary thermal via 600 thus formed can be used as a path of electrons used for electrically charging the copper seed layer 702 in order to diffuse copper, such as positively charged copper, toward the through-hole 510 for forming the primary thermal via 410. After the formation of the primary thermal via 410, which will be described later, the second secondary thermal via 720, and the third secondary thermal via 730 may be electrically connected to the primary thermal via 410 through the first secondary thermal via 710 and the copper seed layer 702.

With regard to the method for forming the through-hole 510 and the primary thermal via 410, the detailed description will be given referring to FIGS. 8 through 10.

Technical descriptions provided with reference to FIGS. 1 through 6 may be applicable hereto and thus, repeated descriptions will be omitted here for brevity.

Figure 8:
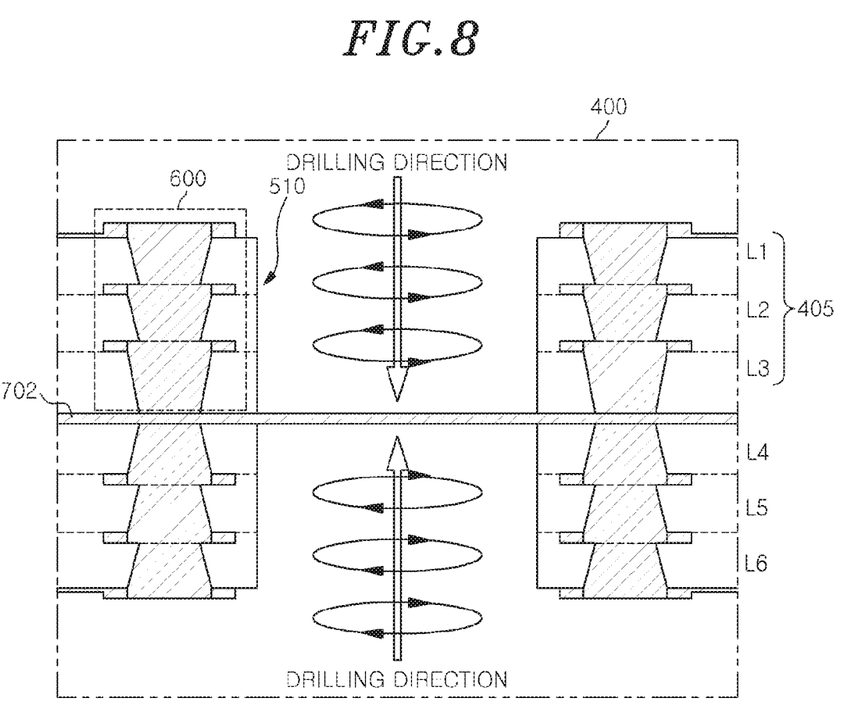
FIG. 8 is a cross-sectional view of a PCB under a manufacturing process in which a through-hole for forming a primary thermal via in accordance with a representative embodiment.

FIG. 8 illustrates a cross-sectional view of the PCB under a manufacturing process in which a through-hole for forming the primary thermal via is formed in accordance with a representative embodiment. With reference FIG. 8, a description will be given of the method for forming the through-hole 510 that is used to form the primary thermal via 410 after secondary thermal vias 420 are formed in a peripheral direction of the area where the primary thermal via 410 will be formed.

The through-hole 510 can be formed by drilling the dielectric layers L1 to L3 from the surface of the PCB 400, and the through-bole 510 may penetrate through the dielectric layers L1 to L3. That is, the through-hole 510 extends from the surface of the PCB 400 to the copper seed layer 702, thus penetrating through the dielectric layer 405. The through-hole 510 may be formed by laser drilling. As can be seen in FIG. 8, the drilling may be performed symmetrically, with the copper seed layer 702 serving as a symmetric axis.

The primary thermal via 410, described with reference to FIG. 5, is formal by filling the through-hole 510 with copper. This filling process will be described in detail with reference to FIGS. 9 and 10.

Technical descriptions provided with reference to FIGS. 1 through 7 may be applicable hereto and thus, repeated descriptions will be omitted here for brevity.

Figure 9:
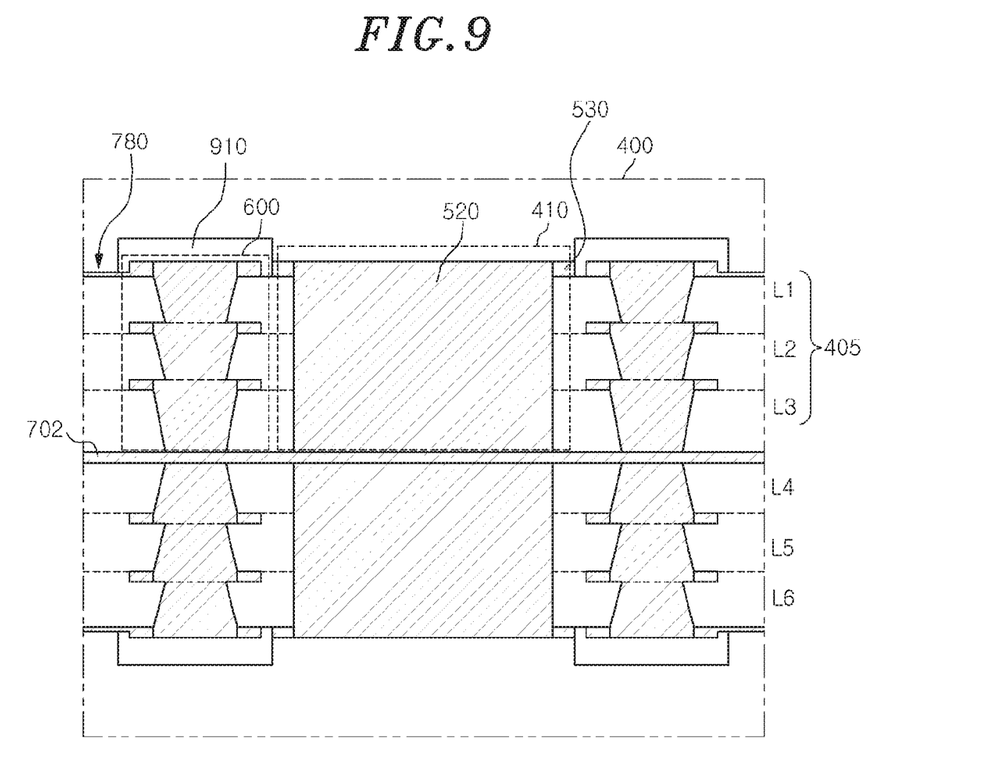
FIG. 9 is a cross-sectional view of a PCB under as manufacturing process in which a through-hole for forming secondary thermal vias and a primary thermal via in accordance with a representative embodiment.

FIG. 9 illustrates a schematic cross-sectional view of the PCB under a manufacturing process in which the secondary thermal vias and the primary thermal via are formed. With reference to FIG. 9, the filling process in which the copper portion 520 is filled in the through-hole 510 is described.

Following the formation of the through-hole 510, the exposed surface of the secondary thermal via 600 may be covered with a dry film 910. The dry film may be formed on the exposed surface of each of the secondary thermal vias. The dry film may function to prevent the copper filled in the through-hole 510 from dissipating out of the through-hole 510, or the thermal via 410, formed by filling the through-hole 510 with the copper portion 520, from being in contact with each of the secondary thermal vias on the surface of the PCB 400.

The PKGSUB machine can be connected with the secondary thermal vias through a PKGSUB pattern 780, for example, made of copper, on a surface of PCB 400, and works to migrate electrons through the secondary thermal vias towards the copper seed layer 702 that is negatively charged. The PKGSUB machine can control a copper tank (not shown) to diffuse electrically charged copper toward the through-hole 510, resulting in the deposition of the copper portion 520 in the through-hole 510. The copper diffusion process for the through-hole 510 may be performed until the through-hole is completely filled with copper or even until an extended space of the through-hole 510 that results from the disposition of the via pad 530 along the periphery of the through-hole 510 is filled with copper. In other words, the exposed surface of the copper portion 520 and the surface of the via pad 530 may be substantially coplanar.

After deposition of the copper portion 520 in the through-hole 510, the PKGSUB pattern 780 and the dry film 910 are removed by, for example, etching.

In the fact that the secondary thermal vias function as a path of electrons used for forming the primary thermal via 410, the resulting primary thermal via 410 is electrically connected with the secondary thermal vias through the copper seed layer 702.

As described above, the secondary thermal vias are disposed in the peripheral direction of the area where the through-hole 510 will be formed, so that charges are evenly distributed over the copper seed layer 702 upon filling the through-hole 510 with copper. In addition, the dry film formed in each of the secondary thermal vias allows the primary thermal via 410 to maintain its desired shape when the filling through-hole 510 with the copper portion 520 is completed or during the filling.

As described above, the dielectric layer, the secondary thermal vias, the thermal via, and the thermal via are individually symmetrically formed reflecting the copper seed layer 702 serving as a symmetric axis.

Technical descriptions provided with reference to FIGS. 1 through 8 may be applicable hereto and thus, repeated descriptions will be omitted her for brevity.

Figure 10:
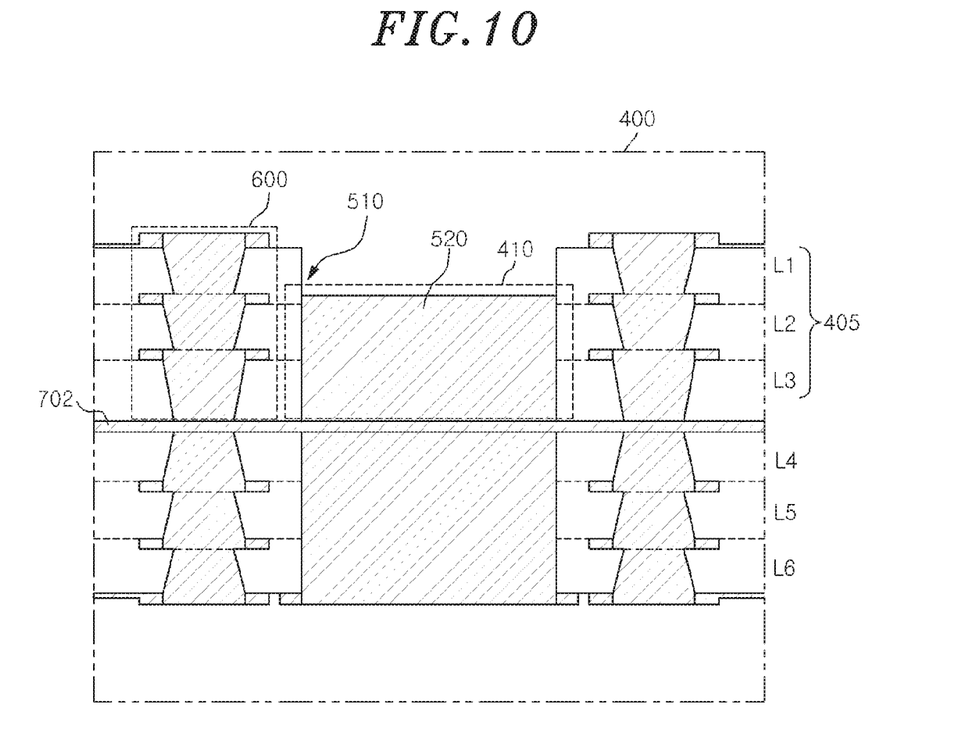
FIG. 10 is a cross-sectional view of PCB in accordance with another representative embodiment.

FIG. 10 shows a cross-sectional view of another exemplary PCB in accordance with a representative embodiment. As shown in FIG. 10, the primary thermal via 410 may be formed when the through-hole 510 is partially filled with the copper portion 520. That is, the deposition height of the copper portion 520 may be shorter than the depth of the through-hole 510. The PKGSUB machine can control the deposition height of the copper portion 520 within the through-hole 510. The amount of copper filled in the through-hole 510 or the deposition height of the copper portion 520 may be determined in accordance with the dimensions of the semiconductor device to be mounted on the mounting portion 540 provided on the surface of the copper portion 520. For example, the amount of copper filled in the through-hole 510 or the deposition height of the copper portion 520 may be controlled lest the semiconductor device to be mounted on the mounting portion 540 is extruded from the surface of the PCB 400.

When the through-hole 510 is partially filled with the copper portion 520, the total length of the primary thermal via 410 is shortened, which makes the time required for the heat sink short.

Technical descriptions provided with reference to FIGS. 1 through 9 may be applicable hereto and thus, repeated descriptions will be omitted here for brevity.

Figure 11:
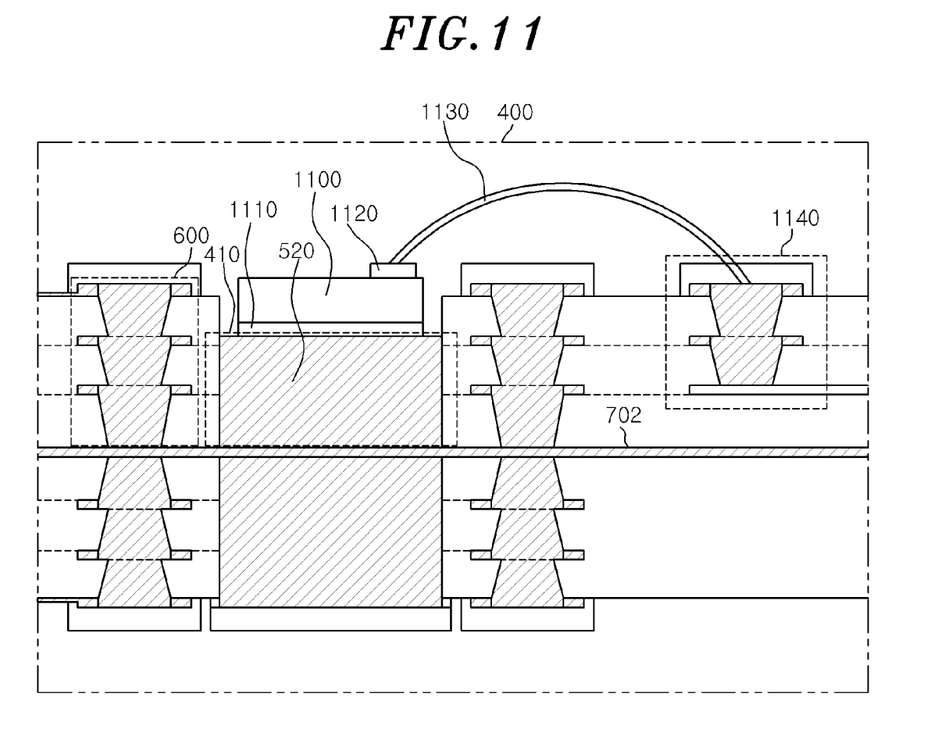
FIG. 11 is a cross-sectional view of a PCB on which a semiconductor device is mounted, in accordance with a representative embodiment.

FIG. 11 illustrates a schematic cross-sectional view of still another exemplary PCB on which a semiconductor device 1100 is mounted, in accordance with a representative embodiment. In FIG. 11, a semiconductor device 1100 is mounted on the mounting portion 540 when the through-hole 510 is partially filled with the copper portion 520, as described in FIG. 10.

The semiconductor device 1100 may be a packaged semiconductor device that comprises a plurality of active semiconductor devices, passive electronic components and electrical circuitry configured to make electrical connections between active semiconductor devices and passive electronic components, for example. As can be appreciated based on many aspects of the present description, in certain representative embodiments, the contemplated semiconductor device 1100 requires heat dissipation to improve performance and reliability. For example, and as noted above, the semiconductor device 1100 may be a power amplifier or may comprise a power amplifier.

The semiconductor device 1100 may be mounted on the mounting portion 540 through an adhesive layer 1110. The semiconductor device 1100 may be connected with a signal via 1140 through a bonding wire 1130 or a jumper connected to a die pad 1120.

Technical descriptions provided with reference to FIGS. 1 through 10 may be applicable hereto and thus, repeated descriptions will be omitted here for brevity.

Figure 12:
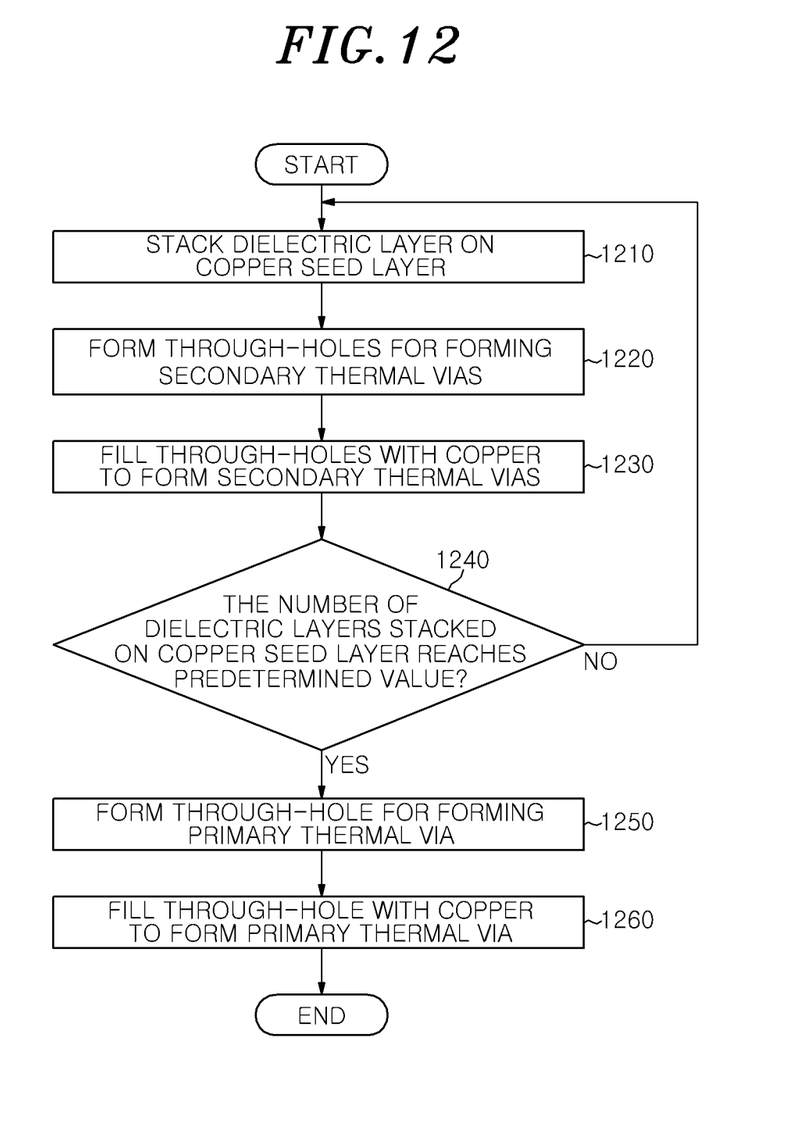
FIG. 12 is a flow chart illustrating a method for forming secondary thermal vias and a primary thermal via in accordance with a representative embodiment.

FIG. 12 is a flow chart illustrating a method for forming the secondary thermal vias and the primary thermal via in accordance with a representative embodiment. Following sequence of steps 1210 to 1240 represents the method for forming the secondary thermal vias in the above-mentioned PCB, as described with reference to FIG. 7, while following sequence of steps 1250 and 1260 describes the method for forming the primary thermal via in the PCB, as described with reference to FIGS. 8 through 10.

At 1210, the PKGSUB machine stacks a dielectric layer on a copper seed layer.

At 1220, the PKGSUB machine forms through-holes used for forming secondary thermal vias in the dielectric layer stacked on the copper seed layer.

At 1230, the PKGSUB machine controls a Cu tank to fill the through-holes with copper, resulting in the formation of the secondary thermal vias. The secondary thermal vias may be disposed in a peripheral direction of an area where a through-hole for the formation of a primary thermal via will be formed.

At 1240, the PKGSUB machine determines whether the number of the dielectric layers stacked on the copper seed layer reaches or exceeds a predetermined value. If the number is not reached, steps 1210 to 1230 are repeated to form a plurality of secondary thermal vias in the multi-layer PCB.

At 1250, the PKGSUB machine forms the through-hole, for forming the primary thermal via, by drilling, in which the through-hole penetrates through the stacked dielectric layers.

At 1260, the PKGSUB machine negatively charges the copper seed layer through the secondary thermal vias by using them as a path of electrons, and then controls a Cu tank to fill the through-hole with copper. The primary thermal via may be formed by filling the through-hole with copper.

The primary thermal via forming process in accordance with performing sequences 1250 and 1260 does not require a process for forming an electroless copper layer as described with reference to FIG. 3. In addition, the primary copper diffusion process is only carried out in the secondary thermal vias forming process in accordance with performing the steps 1210 to 1230, whereby the overall process duration necessary for the formation of thermal vias in the multi-layer PCB can be reduced. Omission of the additional secondary copper diffusion process can significantly reduce the overall time taken to form the thermal vias.

Technical descriptions provided with reference to FIGS. 1 through 11 may be applicable hereto and thus, repeated descriptions will be omitted here for brevity.

In the forming process of the primary thermal via bigger than the conventional thermal via in a PCB in accordance with the embodiments of the present invention, by employing the secondary thermal vias as a path of electrons for electrically charging the copper seed layer instead of an electroless copper layer, copper can be effectively diffused toward the copper seed layer without interference from an electroless copper layer.

In view of this disclosure it is noted that the various PCBs and thermal vias can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

What is claimed is:

1. A printed circuit board (PCB), comprising:
   a copper seed layer;
   at least one dielectric layer provided on the copper seed layer;
   a single primary thermal via having a single first through-hole in the at least one dielectric layer ending at the copper seed layer, and a first copper portion filled in the first through-hole and directly contacting the copper seed layer, thereby enabling a direct electrical and thermal connection between the copper seed layer and the single primary thermal via;
   a plurality of secondary thermal vias disposed peripherally around the single primary thermal via, each of the secondary thermal vias having a second through-hole in the at least one dielectric layer and a second copper portion filled in the second through-hole, the second copper portion directly contacting the copper seed layer at one end, thereby enabling a direct electrical and thermal connection between each of the plurality of secondary thermal vias and the copper seed layer allowing for each of the plurality of secondary thermal vias to be electrically and thermally connected to the single primary thermal via and other secondary thermal vias of the plurality of secondary thermal vias; and
   a mounting portion provided within a surface area of the first copper portion for mounting a semiconductor device thereon,
   wherein an exposed area of the single primary thermal via is larger than an exposed area of each of the secondary thermal vias.

2. The PCB of claim 1, wherein the mounting portion is provided only on the first copper portion.

3. The PCB of claim 1, wherein a shape of the first through-hole on a surface of the PCB is rectangular, as viewed in a direction perpendicular to the surface of the PCB.

4. The PCB of claim 1, wherein a deposition height of the first copper portion is shorter than a depth of the first through-hole.

5. The PCB of claim 1, wherein each of the secondary thermal vias is disposed at a regular interval around the single primary thermal via on a surface of the PCB, as viewed in a direction perpendicular to the surface of the PCB.

6. The PCB of claim 1, wherein a diameter of the second through-hole on a surface of the PCB is 120 μm or less, as viewed in a direction perpendicular to the surface of the PCB.

7. The PCB of claim 1, wherein the first through-hole extends from a surface of the PCB to the copper seed layer and penetrates through the at least one dielectric layer.

8. The PCB of claim 1, wherein the single primary thermal via includes a single primary thermal via pad disposed along a periphery of the single first through-hole on a surface of the PCB, an exposed surface of the first copper portion and a surface of the single primary thermal via pad are substantially coplanar, and
   each of the secondary thermal vias includes a secondary thermal via pad disposed along a periphery of the second through-hole on the surface of the PCB, an exposed surface of each of the second copper portion and a surface of the secondary thermal via pad are substantially coplanar.

9. The PCB of claim 1, wherein a first end of each second copper portion is substantially co-planar with a surface of a secondary thermal via pad disposed along a periphery of the second through-hole on a surface of the PCB, and a second end of each second copper portion corresponds to the one end of the second copper portion directly contacting the copper seed layer.

10. The PCB of claim 1, wherein the plurality of secondary thermal vias are disposed peripherally around all sides of the single primary thermal via.

11. The PCB of claim 1, wherein the at least one dielectric layer comprises an upper dielectric layer stacked on a lower dielectric layer; and
   wherein the plurality of secondary thermal vias comprise a plurality of upper secondary thermal vias stacked on and in contact with a plurality of lower secondary thermal vias.

12. The PCB of claim 11, wherein a diameter at a top of the upper secondary thermal via is substantially identical to a diameter at a top of the lower secondary thermal via as viewed in a direction perpendicular to a surface of the PCB.

13. The PCB of claim 11, wherein the lower and upper secondary thermal vias are connected to the single primary thermal via by the copper seed layer.

14. A printed circuit board (PCB), comprising:
   a plurality of dielectric layers;
   an electrically and thermally conductive seed layer sandwiched between a pair of dielectric layers of the plurality of dielectric layers;
   a single primary thermal via extending to the seed layer within the PCB through at least one of the plurality of dielectric layers, thereby enabling a direct electrical and thermal connection between the seed layer and the single primary thermal via, wherein the single primary thermal via is configured to receive a semiconductor die;

a plurality of secondary thermal vias disposed peripherally around the single primary thermal via to surround the single primary thermal via, the plurality of secondary thermal vias extending from a surface of the PCB to the seed layer through the at least one of the plurality of dielectric layers, thereby enabling a direct electrical and thermal connection between the seed layer and each of the plurality of secondary thermal vias allowing for each of the plurality of secondary thermal vias to be electrically and thermally connected to the single primary thermal via and other secondary thermal vias of the plurality of secondary thermal vias, wherein an exposed area of the single primary thermal via on the surface of the PCB is larger than an exposed area of each of the secondary thermal vias on the surface of the PCB.

15. The PCB of claim 14, further comprising:
a mounting portion provided within a surface area of the single primary thermal via for receiving the semiconductor die, wherein the mounting portion is provided only on the single primary thermal via.

16. The PCB of claim 14, wherein the single primary thermal via has a through-hole and a copper portion filled in the through-hole, and a deposition height of the copper portion is shorter than a depth of the through-hole.

17. The PCB of claim 14, wherein the secondary thermal vias are disposed at a regular interval peripherally around the single primary thermal via on the surface of the PCB, as viewed in the direction perpendicular to the surface of the PCB.

18. An apparatus, comprising:
a printed circuit board (PCB), the PCB comprising:
a copper seed layer;
at least one dielectric layer provided on the copper seed layer;
a single primary thermal via consisting of one first through-hole extending through the at least one dielectric layer of the PCB to the copper seed layer, and a first copper portion filling the one first through-hole, thereby enabling a direct electrical and thermal connection between the copper seed layer and the single primary thermal via;

a plurality of secondary thermal vias disposed around an entire periphery of the single primary thermal via, each of the secondary thermal vias having a second through-hole in the at least one dielectric layer and a second copper portion filled in the second through-hole and directly contacting the copper seed layer at one end of the second copper portion, wherein only the one end of each second copper portion is directly electrically connected to the copper seed layer, thereby enabling a direct electrical and thermal connection between each of the plurality of secondary thermal vias and the copper seed layer allowing for each of the plurality of secondary thermal vias to be electrically and thermally connected to the single primary thermal via and other secondary thermal vias of the plurality of secondary thermal vias; and a mounting portion provided on the first copper portion and within a surface area of the first copper portion; and the semiconductor device disposed over the mounting portion, wherein an exposed area of the single primary thermal via is larger than an exposed area of each of the secondary thermal vias.

19. The apparatus of claim 18, the PCB further comprising a signal via separate from the single primary thermal via and the plurality of secondary thermal vias; and
bonding wire connecting the semiconductor device to the signal via.

20. The apparatus of claim 18, wherein the at least one dielectric layer comprises an upper dielectric layer stacked on a lower dielectric layer;
wherein the plurality of secondary thermal vias comprise a plurality of upper secondary vias stacked on and in contact with a plurality of lower secondary thermal vias.

21. The apparatus of claim 20, wherein each of the upper secondary thermal vias comprises a first end at a surface of the PCB and a second end opposite the first end, and wherein each of the upper secondary thermal vias is electrically and thermally connected to a corresponding one of the lower secondary thermal vias only by contact through the second end.

* * * * *